(12) United States Patent
Pelman et al.

(10) Patent No.: US 9,831,365 B2
(45) Date of Patent: Nov. 28, 2017

(54) PHOTOVOLTAIC MODULE CARRIER AND METHODS OF USE

(71) Applicant: SunLink Corporation, Mill Valley, CA (US)

(72) Inventors: Todd Pelman, San Francisco, CA (US); Martin N. Seery, San Rafael, CA (US); Jeff Hartnett, Fairfax, CA (US)

(73) Assignee: Sunlink Corp., Mill Valley, CA (US)

( * ) Notice: Subject to any disclaimer, the term of this patent is extended or adjusted under 35 U.S.C. 154(b) by 545 days.

(21) Appl. No.: 14/487,656

(22) Filed: Sep. 16, 2014

(65) Prior Publication Data

US 2015/0000099 A1   Jan. 1, 2015

Related U.S. Application Data

(62) Division of application No. 13/317,141, filed on Oct. 11, 2011, now Pat. No. 8,887,920.

(51) Int. Cl.
*H01L 31/042*   (2014.01)
*H01L 31/043*   (2014.01)
*H01L 31/02*   (2006.01)

(52) U.S. Cl.
CPC ........... *H01L 31/042* (2013.01); *H01L 31/02* (2013.01); *H01L 31/043* (2014.12); *Y02B 10/12* (2013.01); *Y10T 29/4978* (2015.01); *Y10T 29/49355* (2015.01); *Y10T 29/49778* (2015.01); *Y10T 29/49815* (2015.01); *Y10T 29/49826* (2015.01); *Y10T 29/49948* (2015.01); *Y10T 29/49963* (2015.01)

(58) Field of Classification Search
CPC ........... Y10T 29/49778; Y10T 29/4978; Y10T 29/49948; Y10T 29/49963; Y10T 29/49815; Y10T 29/49355; F24J 2/52; F24J 2002/4665; F24J 2002/4667; F24J 2002/4663; F24J 2002/5279; F24J 2002/5281; H01L 31/042; H01L 31/043
See application file for complete search history.

(56) References Cited

U.S. PATENT DOCUMENTS

2009/0230265 A1* 9/2009 Newman ................ F24J 2/5205
  248/229.11
2009/0320907 A1* 12/2009 Botkin ................... F24J 2/5211
  136/251

* cited by examiner

*Primary Examiner* — Jermie Cozart
(74) *Attorney, Agent, or Firm* — Reed Smith LLP

(57) ABSTRACT

A novel PV module carrier and methods of use provide protection for PV modules during transportation, field handling, and assembly with racking systems. The carrier contains elements of a racking system to allow for quicker installation in the field. The PV module carrier reduces manufacturing costs by eliminating the need for frame elements, while reducing field installation time and labor cost for system installation.

5 Claims, 9 Drawing Sheets

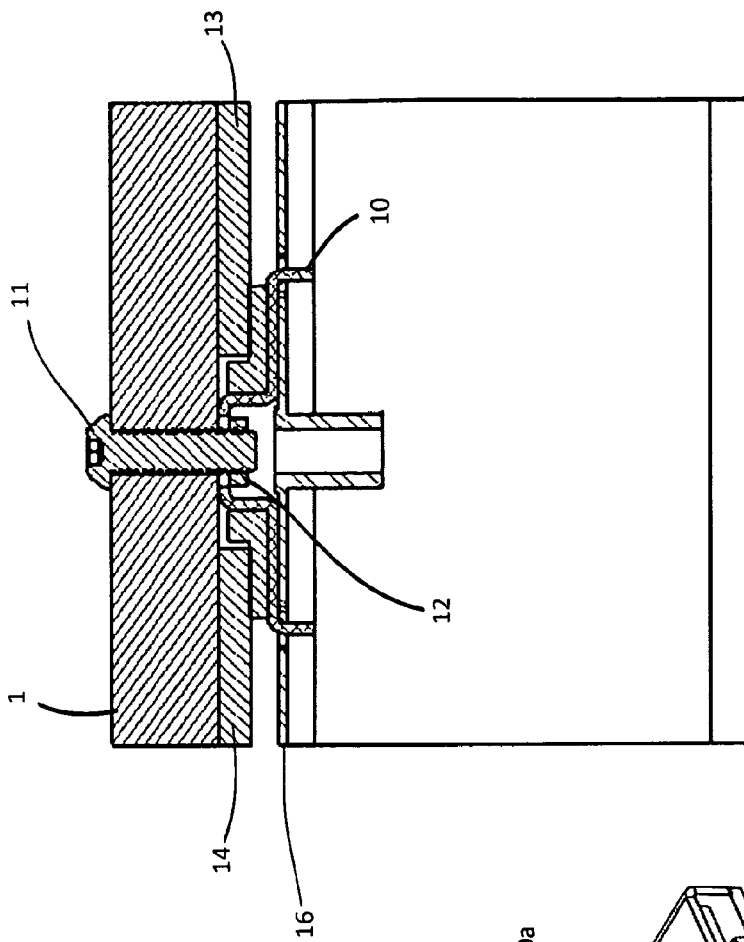
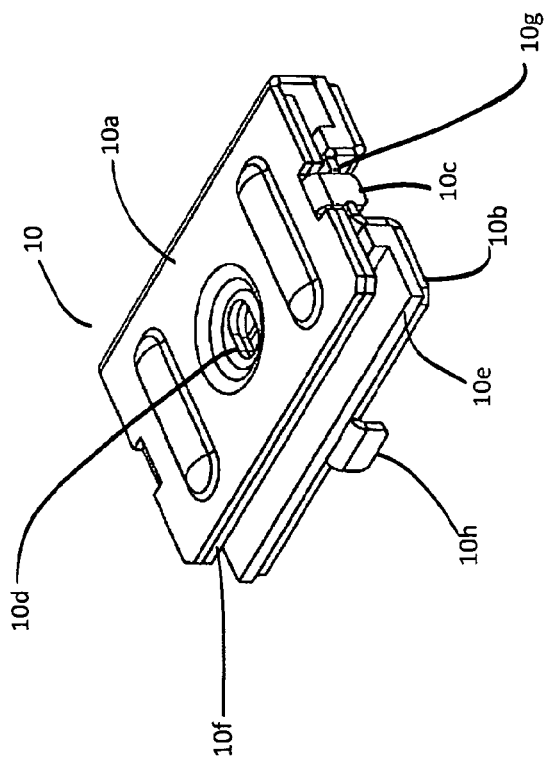
FIGURE 2A
FIGURE 2B

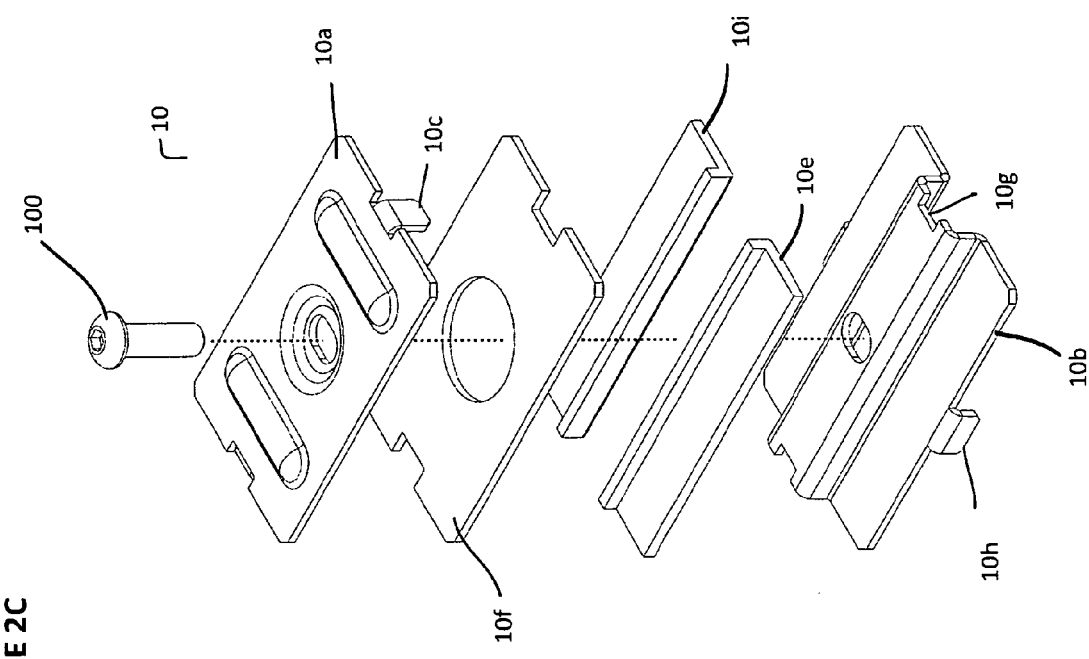

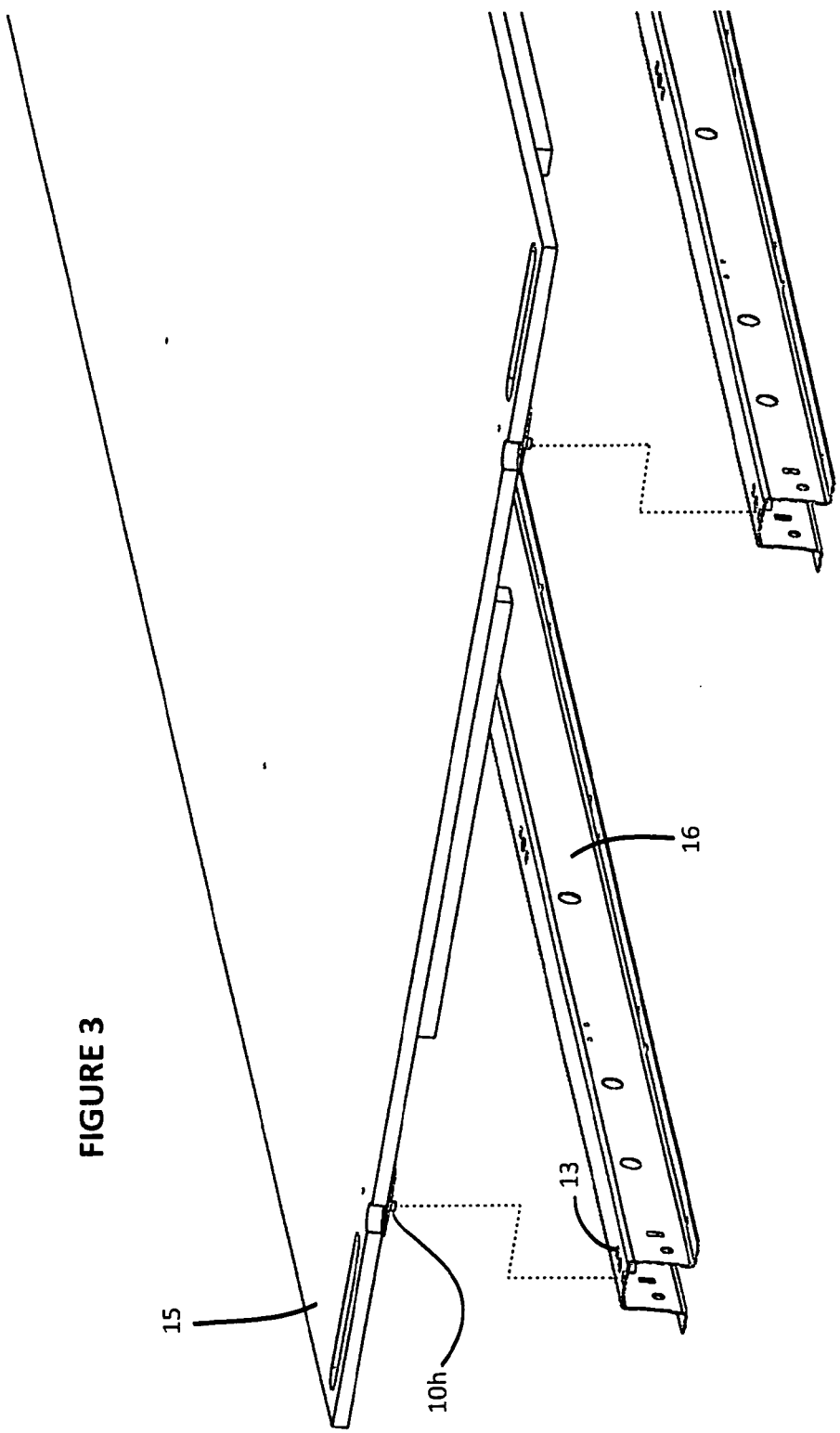

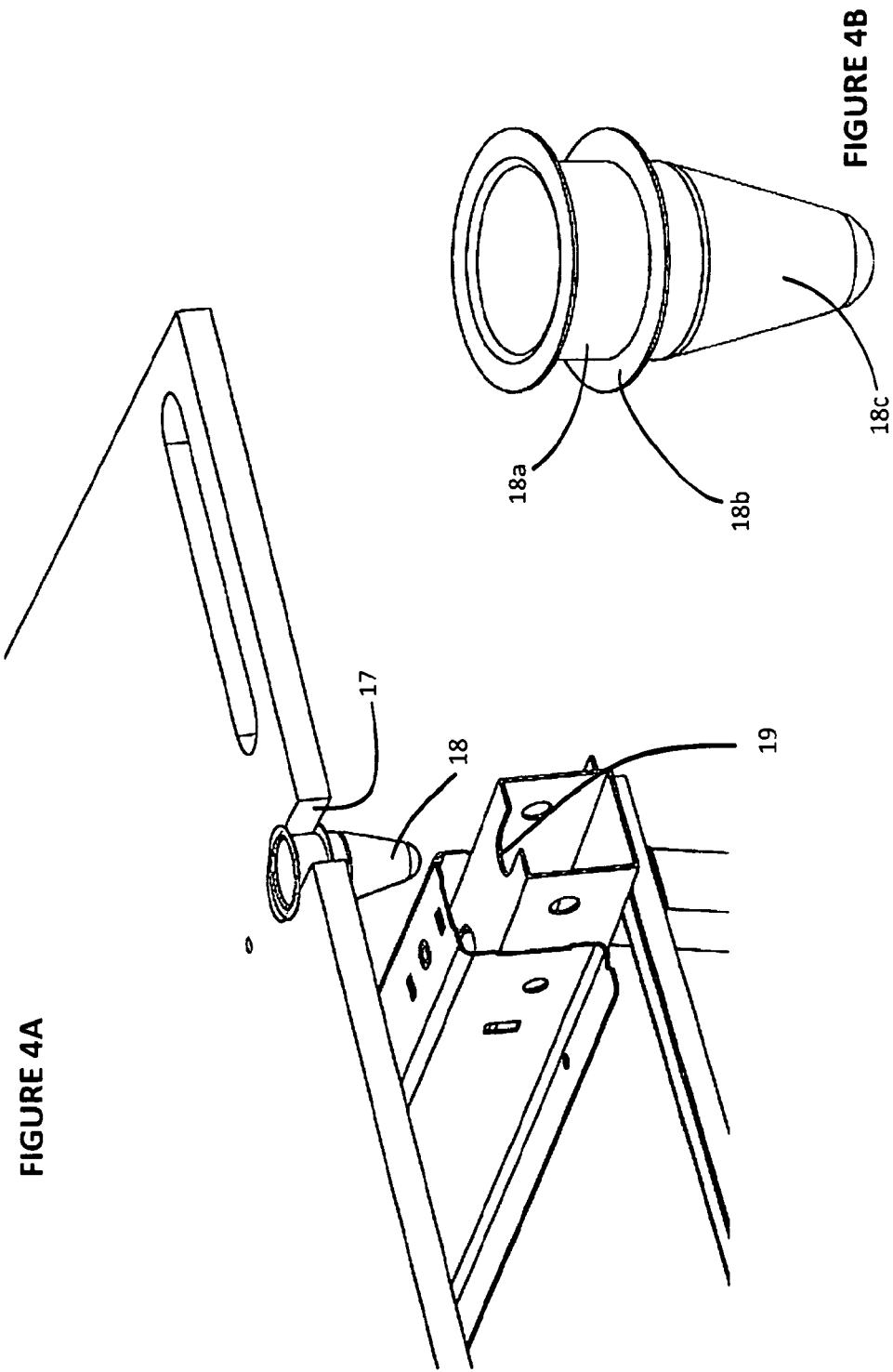

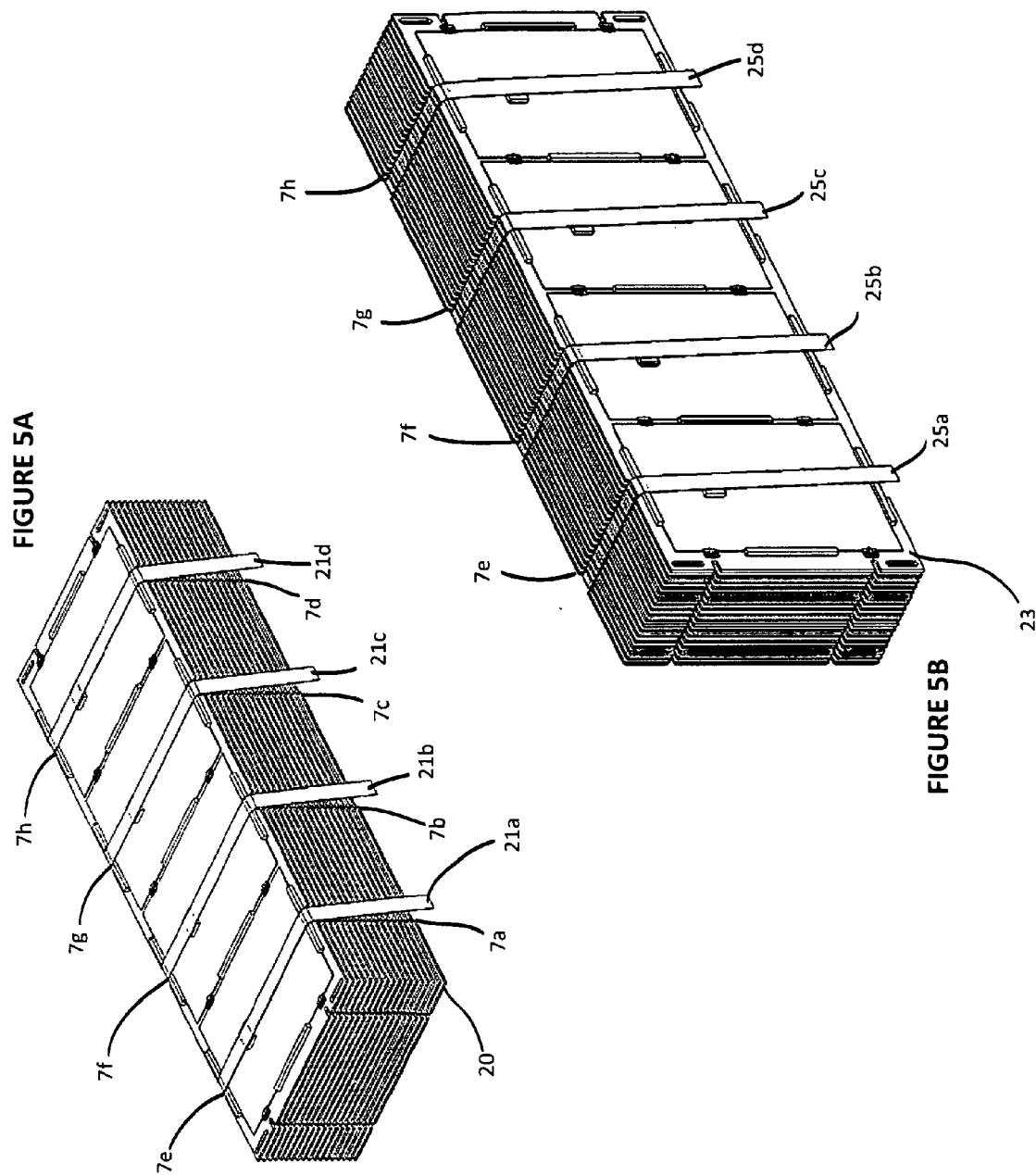

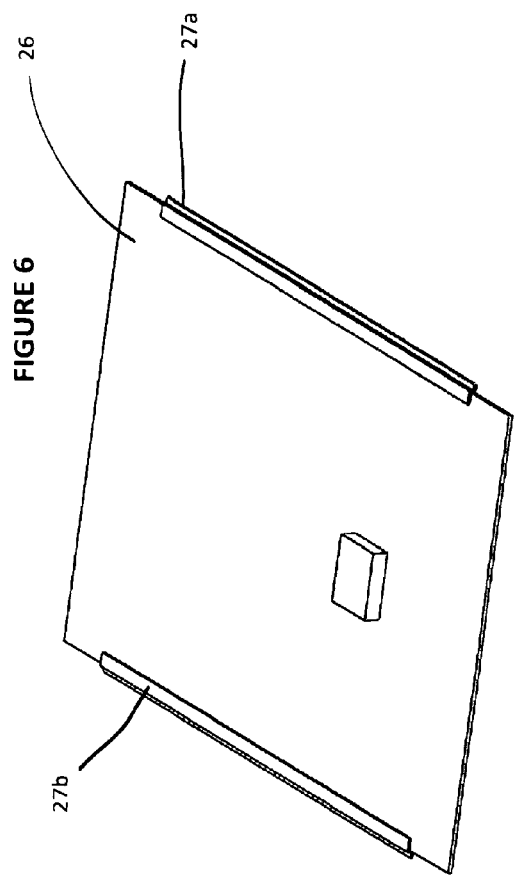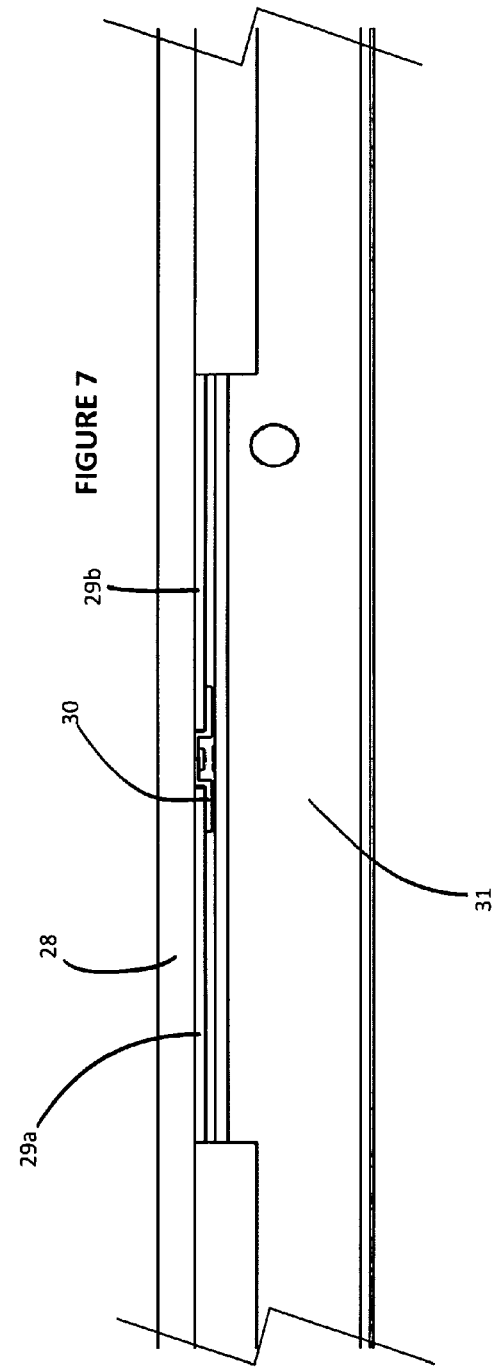

PHOTOVOLTAIC MODULE CARRIER AND METHODS OF USE

CROSS-REFERENCE TO RELATED APPLICATION

This is a Divisional of U.S. patent application Ser. No. 13/317,141, filed 2011 now U.S. Pat. No. 8,887,920 B2.

BACKGROUND OF THE INVENTION

1. Field of the Invention

The present invention relates generally to a photovoltaic laminate module carrier, and more particularly to a photovoltaic module carrier that is optimized for shipping a plurality of modules as a set, and for facilitating quick and easy assembly of the modules to a mounting rack system.

2. Description of the Related Art

Currently, crystalline photovoltaic (PV) laminate modules comprise layers of glass, modular solar cells with their supporting electrical and mechanical connections, and an aluminum frame. The aluminum frame provides protection during transportation and installation for the glass surrounding the solar cells, protects them against the elements for the duration of their working life, and is part of the traditional method of attaching the module to the mounting structure or racking. Because aluminum is a conductor, a grounding element is required for each module. The cost for the PV module frame is roughly 10% of the entire PV module cost. There are additional costs for the labor and materials to ground the frames to the racking.

Currently, the PV modules are manufactured with the aluminum frame at a factory, and are then shipped either directly to an installation site or to a warehouse. Regardless, the modules must be transported to an installation site, where they must be individually handled and installed on the mounting structure at the installation site. As the PV solar industry continues to mature, different aspects of the sector are getting further scrutiny. Particularly, the total costs, including materials and labor costs for installing and deploying PV systems, often referred to as Balance of System (BOS), has become a focus for cost reduction.

One way to reduce the overall system costs would be to eliminate the aluminum frame from each module. However, this raises issues for safe shipping and assembly at the installation site. Thus, there is a need for an improved technique to safely ship PV modules and to reduce the installation and labor costs at the installation site.

SUMMARY OF THE INVENTION

In general, the present invention is a novel PV module carrier and methods of use that provide protection for PV modules during transportation, field handling, and assembly with racking systems. The carrier contains elements of a racking system itself, to allow for quicker installation in the field. The PV module carriers reduce manufacturing costs by eliminating the need for frame elements, while reducing field installation time and labor cost for system installation.

More particularly, according to one embodiment, an apparatus for transporting at least one photovoltaic module comprises a carrier base, a plurality of nesting guides formed on a first and second edge of the carrier base, and a plurality of location guides formed on the carrier base and aligned generally parallel to an edge of the carrier base, wherein the nesting guides and location guides form at least one opening on the carrier base for receiving a photovoltaic module.

The apparatus may further comprise handlings slots to facilitate handling of the carrier. In addition, the apparatus may further comprise two alignment guide openings at the first end of the carrier base, and a two alignment guide openings formed at a second end of the carrier base. The carrier base may include strap alignment slots to allow shipping straps to tie down a stack of carriers for shipping. The carrier base may include mounting holes for attaching the PV modules to the carrier. A plurality of mounting clips may be used to attach the PV modules to the carrier. Various alignment features may be included to facilitate alignment of the PV modules with the mounting system.

According to another embodiment, a photovoltaic module carrier assembly comprises a carrier base, a plurality of nesting guides formed on a first and second edge of the carrier base, a plurality of location guides formed on the carrier base and aligned generally parallel to an edge of the carrier base; wherein the nesting guides and location guides form at least two openings on the carrier base for receiving photovoltaic modules, a photovoltaic module positioned in each opening on the carrier base, a plurality of mounting structure elements attached to the photovoltaic modules, and a plurality of fasteners attaching the modules to the carrier base.

The PV module carrier assembly may further comprise handlings slots to facilitate handling of the carrier. In addition, the apparatus may further comprise two alignment guide openings at the first end of the carrier base, and a two alignment guide openings formed at a second end of the carrier base. The carrier base may include strap alignment slots to allow shipping straps to tie down a stack of carriers for shipping. The carrier base may include mounting holes for attaching the PV modules to the carrier. A plurality of mounting clips may be used to attach the PV modules to the carrier. Various alignment features may be included to facilitate alignment of the PV modules with the mounting system.

A method for transporting photovoltaic modules according to one aspect of the present invention comprises: placing a plurality of modules on a carrier, the carrier including alignment guides, attaching a plurality of photovoltaic modules to the carrier, and attaching a plurality of mounting structure elements to the plurality of modules. The method may further comprise stacking and/or strapping multiple carriers together to form a stack of photovoltaic module carriers.

A method of installing photovoltaic modules according to another aspect of the present invention includes placing a photovoltaic module carrier on a mounting structure, detaching the carrier from at least one module, removing the module carrier, and attaching the at least one module to the mounting structure. The step of placing may comprise aligning alignment elements on the carrier and the mounting structure, in order to align the at least one module to mounting elements on the mounting structure.

BRIEF DESCRIPTION OF THE DRAWINGS

The present invention will be readily understood by the following detailed description in conjunction with the accompanying drawings, wherein like reference numerals designate like structural elements, and in which:

FIG. 2A is a side section view of a PV laminate module carrier installed on top of a PV module racking structure;

FIG. 2B is an isometric elevation view of a module clip according to one embodiment of the present invention;

FIG. 2C is an exploded view of the clip of FIG. 2B;

FIG. 3 is an isometric exploded view of a PV laminate module carrier;

FIG. 4A is an isometric elevation view of a PV laminate module carrier assembled to a racking structure;

FIG. 4B is an isometric elevation view of an embodiment of a gross alignment plug according to one embodiment of the present invention;

FIG. 5A is an isometric view of a flat or horizontal stack of a PV laminate module carriers with shipping straps;

FIG. 5B is a isometric view of a vertical stack of PV laminate module carriers with shipping straps;

FIG. 6 is an isometric view of a PV module having an adhered racking mount feature, according to one embodiment of the present invention;

FIG. 7 is a side elevation sectioned view of a PV laminate module carrier assembled to a racking structure, according to an embodiment of the present invention.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

As described above, there is a desire to remove the PV module frames from the modules in order to reduce over-all system costs. According to the present invention, a novel PV module carrier is used to provide protection during transportation, field handling, and assembly with racking systems. The carrier further contains elements of a racking system itself, to allow for quicker installation in the field. The PV module manufacturers have an incentive to utilize the carriers to reduce costs without a significant burden to current production processes. Furthermore, the PV module installers will benefit from reduced installation time and labor cost for system installation, as well as a reduction in cost for the modules themselves.

More particularly, the novel PV carrier enables PV modules to be assembled on to certain racking components in an indoors factory setting. Typically this assembly yields a panel having three or four PV modules assembled to mounting beams and the associated fastening hardware. This has the advantage of increasing production quality and decreasing costs compared to rooftop or ground work in the field.

Figure 1:
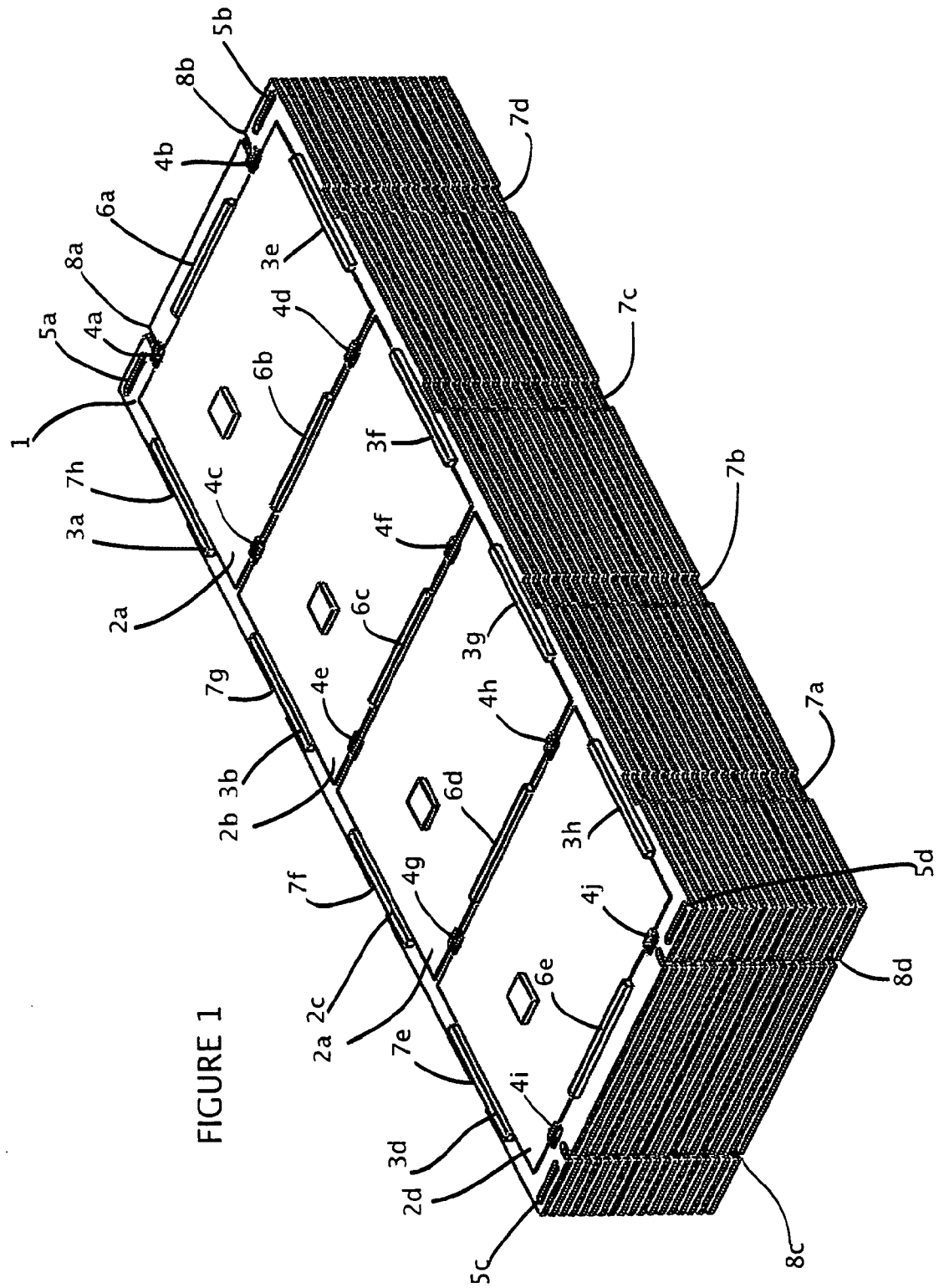
FIG. 1 is an isometric view of a stack of PV laminate module carriers, according to one embodiment of the present invention.

FIG. 1 is an isometric view of a stack of PV laminate carriers, according to one embodiment of the present invention. As illustrated, a plurality of PV module carrier bases 1 are stacked on top of each other. Each carrier 1 contains a plurality of PV module laminates 2a-2d, which are assembled to a PV carrier base 1, using various nesting guides 3a-3h and location guides 6a-6e to align the modules into place on the carrier 1. PV module clips 4a-4j fasten the modules together and can be used to mount the panel assembly directly to a PV mounting structure. The specific clips used can vary depending on the requirements of the intended mounting structure.

The nesting guides 3a-3h and location guides 6a-6e allow for easy placement of the PV module laminates in the PV module carrier, while aligning the PV modules such that they are in the proper location to be assembled quickly and efficiently to a PV racking system at an installation site. The nesting guides 3a-3h and location guides 6a-6e, in combination with the PV module clips 4a-4j, further reduce PV module movement during transport, as well as providing protection from damage. Since it is desirable to be able to easily and quickly align carriers to one another, cut outs 7a-7h, 8a-8d may be used as guides while stacking the carriers. In addition, these features may interact with pins, bars, jigs or brackets (not shown) that could be temporarily assembled to the carriers, in order to keep the carriers aligned while stacking.

As illustrated in FIG. 1, the PV modules 2a-2d are assembled in the carrier with the photovoltaic surface facing down, which has the advantage that it eliminates steps from the installation procedure when mounting the PV modules to the PV racking system. Handling slots 5a-5d are designed so that installers may easily handle and manipulate the PV carriers 1 during the installation of the PV modules to the PV racking system The PV carrier base may be made of plywood, or may be a thermal plastic formed from pressure or heat, that could contain the module and nesting features within its geometry (formed in). The PV carrier base may also be molded from a thermal plastic using rotational molding, or reaction molding, or could be injected molded as structural foam. Additionally, the PV carrier base could comprise a composite that is formed from a mold such as fiberglass.

The PV racking components that secure the laminates to the PV carrier base could be comprise a strip (or strips) of structural material (not shown), that is adhered or fastened to the non PV generating side of the PV modules that contain the necessary locating and securing features that enable the PV modules to be quickly assembled to the PV Racking system, either by snap, hook, fastener, adhesive, or combinations thereof.

Figure 1A:
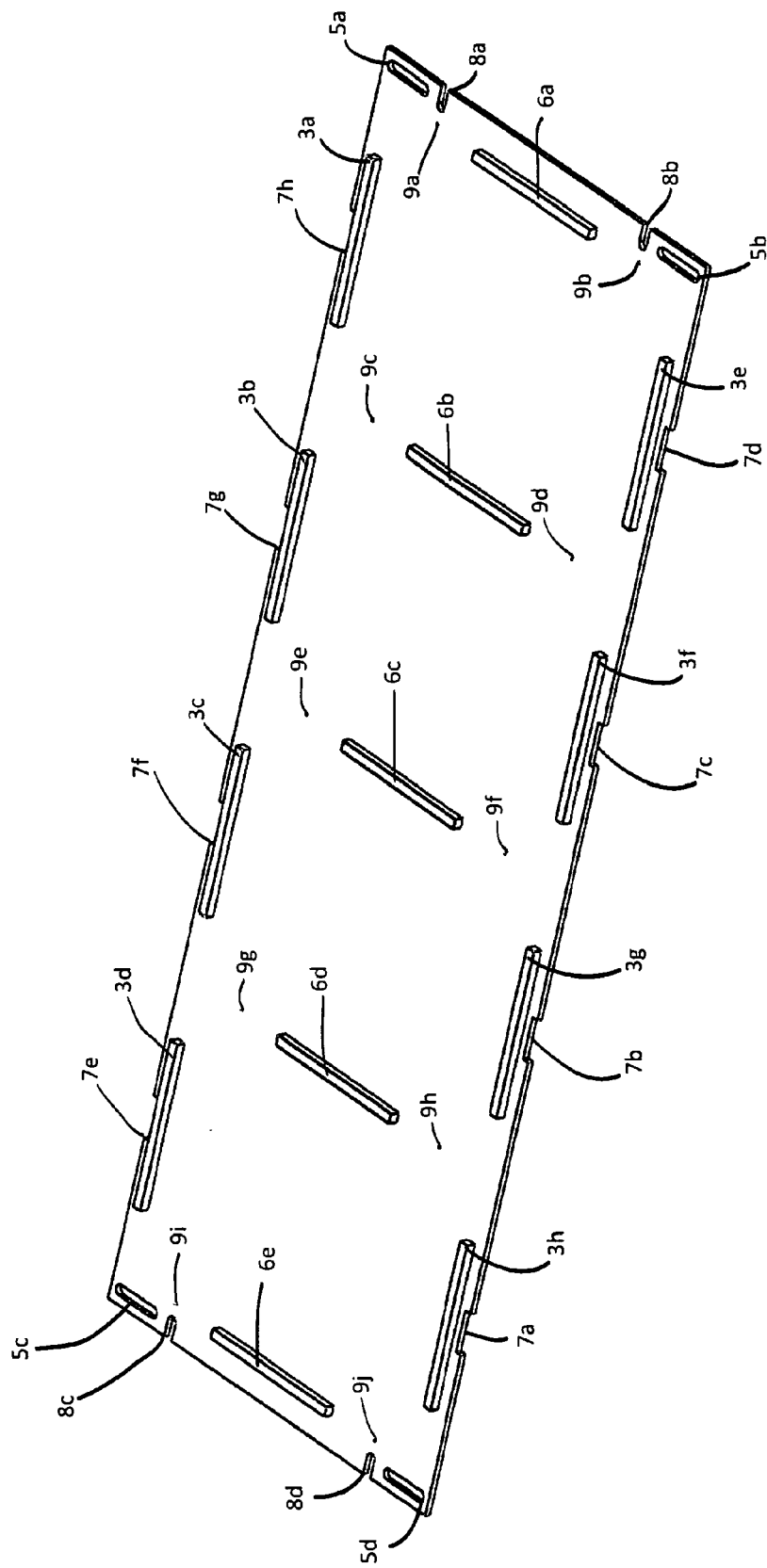
FIG. 1A is an isometric view of single PV laminate module carrier, according to an embodiment of the present invention.

FIG. 1A illustrates a single carrier base 1, without any PV modules installed. In a preferred embodiment, the carrier base is reusable, and after installation of the PV modules, the carrier base is returned to the manufacturer. Note that the carrier base 1 includes mounting holes 9a-9j for securing the PV modules to the carrier.

FIG. 2A illustrates a side section view of a PV carrier assembly 1 on top of a PV racking structural rail 16. The two PV modules 13, 14 are connected by a mounting clip 10. A carrier clip fastener bolt 11 secures the panel assembly to the carrier base 1 via a carrier retention nut plate 12.

In further detail, PV modules 13, 14, shown as laminates in this embodiment, are secured to the PV module carrier base 1 with a PV module clip 10 that securely clamps the PV module between the clip 10 and the base using fastener bolt 11 and nut plate 12. The PV carrier assembly 1 containing the secured PV modules 13, 14 is shown resting on a PV racking structural component 16. This position is the preferred final location for the PV modules relative to the PV racking system such that the PV modules are optimally secured. For example, once the carrier base 1 is properly positioned, the fastener bolt 11 (and others not shown), can be removed, and the carrier base 1 separated from the PV modules. The fastener bolt 11, or any other suitable attachment hardware for the specific mounting structure 16, can then be used to securely attach the module clip 10 to the mounting rail 16.

FIG. 2B illustrates an embodiment of a PV module clip 10 suitable for use with the present invention. The PV module clip 10 comprises an upper clip 10a and a lower clip 10b. Preferably, the upper clip 10a is separate from the lower clip 10b for quick and versatile assembly of the PV modules to the racking components. The upper clip 10a and lower clip 10b each have an elastomeric pad 10e, 10f adhered to them such that a PV module laminate may be safely secured between a lower elastomeric pad 10e and an upper elastomeric pad 10f.

It is also preferred to be able to quickly distinguish between an upper clip and a lower clip, while preventing the clip assembly from rotating when securing it to the racking component with a fastener. For arresting rotation between the upper and lower clips, the upper clip 10a may have a tongue feature 10c that locates to the lower clip 10b in between a cut out 10g. For both ease of assembly and preventing rotation between the racking components and the lower clip, a tongue 10h may be used to locate to a cut out slot located in the racking component (not pictured).

FIG. 2C illustrates an exploded view of the clip of FIG. 2B. Note that there are two elastomeric pads 10e, 10i on the lower clip 10b. Also, a fastening element 100 is used to second the upper and lower clips elements 10a, 10b together.

As can be appreciate by those skilled in the art, it is preferable to be able to efficiently install PV modules to a PV racking system in a quick and efficient manner. As described herein, once the PV carrier assembly is located correctly on the PV racking system, the PV module carrier is decoupled from the modules, allowing the PV module carrier to be removed. The modules can then be quickly attached to the racking system. Thus, the present invention reduces the amount of time necessary to align and install the PV modules.

FIG. 3 is an isometric exploded view of a PV laminate carrier base 15, a PV racking structural rail 16, a PV racking structural rail location feature 13, and a PV racking system module clip location feature 10h, according to an embodiment of the present invention.

As illustrated, FIG. 3 depicts additional details for locating a PV module carrier assembly 15 to a PV racking structural component 16 (rail). The PV module carrier assembly 15 includes a plurality of PV module clips (described above) that act to secure the PV modules to the PV carrier base for transport as well as for locating and securing the PV module clips to the PV racking structural components. The PV module clips may include a location feature 10h (such as a metal tongue) to align the carrier assembly 15 to a PV module mounting system structural component 16. The structural component may include a complementary location feature 13 (such as a slot or groove in the rail). In the illustrated embodiment, the module clip location feature 10h is tab or tongue that locates to a slot feature 13 in the PV racking system structural component 16.

The connection between module clip and racking structural feature allows enough freedom of movement in horizontal and vertical axis such that every PV module clip can adequately locate to a corresponding location feature on the PV racking structural components. It is desired to be able to locate and place a plurality of PV modules within one installation operation. The location features on both PV module clips and PV racking structural components are equally spaced relative to one another. Additional embodiments of this location feature (not pictured) could include some combination of hook, bayonet, hole, rib, boss, fastener, dowel, pin, slot, lip, edge.

It may also be desirable to have a more gross alignment scheme that allows for alignment between the PV carrier assembly and PV racking system. FIG. 4A is an isometric elevation of a PV carrier base assembled to a PV racking system. The carrier base includes a carrier gross alignment feature 18, and the racking system includes a racking system gross alignment feature 19. In this embodiment, the racking gross alignment feature includes a cut-out 17 through a wall that is able to accept the gross alignment feature 18. The cut-out 17, for example, corresponds to the cut-outs 8a-8d on the end of the carriers shown in FIGS. 1 and 1A.

FIG. 4B depicts an embodiment of the gross alignment feature containing a round surface 18a and a bottom lip 18b, which act in concert to temporarily secure the gross alignment feature 18 to the carrier during installation. It is desirable to have a tapered surface 18c for a gradual interface between the gross alignment feature 18 and the racking system gross alignment feature 19.

In further detail, the carrier gross alignment feature 18 may be formed as a tapered plug or pin, which may be made from metal using a deep drawn process, or formed from a sheet, machined, extruded, and/or bent. Other embodiments of the carrier gross alignment feature 18 may comprise a thermal plastic that is pressure formed, injection molded, cast, or extruded. Further geometrical embodiments of the gross alignment feature 18 can be a cruciform, rib, edge, return, bar, lip, or taper. The racking system gross alignment feature 19 may be formed as a cut-out 19 in a racking system structural rail, for example.

It may be desirable to be able to easily remove and install the carrier gross alignment feature 18 in order to maximize transport density. In this embodiment, the carrier gross alignment feature 18 may attach to a cutout 17 formed in the carrier base specifically to temporarily secure the gross alignment feature 18 to the PV carrier base. For example, the carrier gross alignment feature 18 has a returned flange that engages with the top of the PV carrier base 17. This allows for gross alignment feature installation from either the top or side. The sides of the cutout 17 secure the gross alignment feature 18 to the PV carrier base using friction. Additional embodiments (not pictured) of securing the gross alignment feature 18 to the PV carrier base may be temporary or permanent and use friction, adhesive, fasteners, rivets, or complimentary geometry between components.

FIGS. 5A and 5B illustrate two possible shipping orientations for a plurality of PV module carrier assemblies nested in either a horizontal or flat orientation, or a vertical or side orientation. FIG. 5A is an isometric view depicting a flat or horizontal stack of PV carrier assemblies 20, having horizontal straps 21a-21d to secure the stack of PV carriers for transport and shipping. The carrier assemblies 20 may include strap alignment features 7a-7h on each PV carrier assembly, as previously illustrated in FIG. 1.

Similarly, FIG. 5B is an isometric view depicting a vertical stack of PV carrier assemblies 23, having vertical straps 25a-25d to secure vertical stack for transport and shipping. The carrier assemblies 23 may include strap alignment features 7e-7h on each PV carrier assembly. For certain types of modules and/or transport systems it may be desirable to pack the carriers in a vertical manner, in order to maintain PV module safety or for space maximization. Alternative embodiments of securing PV module carrier assembly stacks for shipping (not pictured) may include: shrink wrapping, metal bands, tape, brackets, or staples.

In alternative embodiments, it may be desirable to include additional and/or different elements on the modules and/or carriers to further facilitate alignment or mounting on to a mounting structure. For example, FIG. 6 illustrates an isometric view of a PV module 26 that has adhered racking mount features 27a, 27b. In this specific embodiment, the mounting elements 27a, 27b comprise a piece of metal that communicates directly with the mounting system.

FIG. 7 is a side elevation sectioned view of a carrier 28, which is assembled to racking component 31, with an adhered racking mounting feature 30 and a PV module 29. In further detail, a PV module 29 is simultaneously assembled to the carrier 28 and the racking structural member 31 using the adhered element 30. The connection between the adhered element and the racking structural support could be a hook, bracket, latch, fastener, or clamp such that it is easy to assemble and secured to the racking system.

A method for transporting photovoltaic modules according to one aspect of the present invention comprises placing a plurality of modules on a carrier, the carrier including alignment guides, attaching a plurality of photovoltaic modules to the carrier, and attaching a plurality of mounting structure elements to the plurality of modules. The method may further comprise stacking and/or strapping multiple carriers together to form a stack of photovoltaic module carriers.

Figure 8:
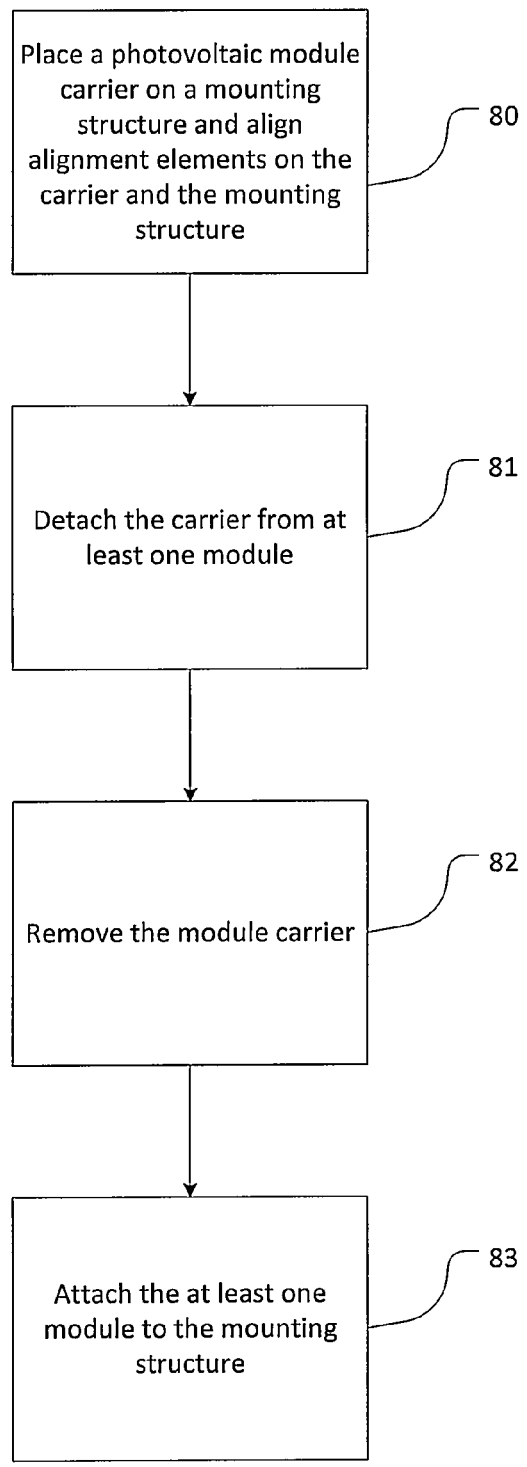
FIG. 8 is a flowchart illustrating a method of installing photovoltaic modules according to one embodiment of the present invention.

A method of installing photovoltaic modules according to another aspect of the present invention is illustrated in FIG. 8. As shown, the method includes placing a photovoltaic module carrier on a mounting structure (step 80), detaching the carrier from at least one module (step 81), removing the module carrier (step 82), and attaching the at least one module to the mounting structure (step 83). The step of placing (step 80) may comprise aligning alignment elements on the carrier and the mounting structure, in order to align the at least one module to mounting elements on the mounting structure.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:

1. A method for transporting photovoltaic modules comprising:
   placing a plurality of modules on a carrier, the carrier including alignment guides;
   attaching a plurality of photovoltaic modules to the carrier; and
   attaching a plurality of mounting structure elements to the plurality of modules.

2. The method of claim 1 further comprising stacking multiple carriers together to form a stack of photovoltaic module carriers.

3. The method of claim 2, further comprising strapping the stack of module carriers together for transport.

4. A method of installing photovoltaic modules comprising:
   placing a photovoltaic module carrier on a mounting structure;
   detaching the carrier from at least one module;
   removing the module carrier; and
   attaching the at least one module to the mounting structure.

5. The method of claim 4, wherein the step of placing comprises aligning alignment elements on the carrier and the mounting structure, in order to align the at least one module to mounting elements on the mounting structure.

* * * * *